United States Patent
Trivedi et al.

(10) Patent No.: US 8,026,754 B2
(45) Date of Patent: Sep. 27, 2011

(54) LOW LATENCY FLOP CIRCUIT

(75) Inventors: Pradeep R. Trivedi, Sunnyvale, CA (US); Honkai Tam, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 233 days.

(21) Appl. No.: 12/371,114

(22) Filed: Feb. 13, 2009

(65) Prior Publication Data
US 2010/0207677 A1    Aug. 19, 2010

(51) Int. Cl.
*H03K 3/356* (2006.01)
(52) U.S. Cl. ........................ 327/208; 327/214; 327/225
(58) Field of Classification Search .................. 327/208, 327/210–212, 214, 225
See application file for complete search history.

(56) References Cited

U.S. PATENT DOCUMENTS

| | | | | |
|---|---|---|---|---|
| 5,764,089 A * | 6/1998 | Partovi et al. | ................. | 327/200 |
| 5,986,490 A * | 11/1999 | Hwang et al. | ................. | 327/202 |
| 5,990,717 A * | 11/1999 | Partovi et al. | ................. | 327/210 |
| 6,181,180 B1 * | 1/2001 | Chen et al. | ................. | 327/211 |
| 6,597,223 B2 * | 7/2003 | Vangal et al. | ................. | 327/202 |
| 6,693,459 B2 * | 2/2004 | Nedovic et al. | ................. | 326/93 |
| 6,700,425 B1 * | 3/2004 | Pilling | ................. | 327/291 |
| 6,825,694 B2 * | 11/2004 | Yoo | ................. | 326/95 |
| 7,027,345 B2 * | 4/2006 | Nedovic et al. | ................. | 365/226 |
| 7,301,373 B1 * | 11/2007 | Bailey et al. | ................. | 327/55 |
| 7,417,907 B1 * | 8/2008 | Liu et al. | ................. | 365/196 |
| 7,449,924 B2 | 11/2008 | Vincent | | |
| 7,471,580 B2 | 12/2008 | Henzler et al. | | |
| 2008/0218235 A1 * | 9/2008 | Sekine et al. | ................. | 327/212 |

* cited by examiner

*Primary Examiner* — Lincoln Donovan
*Assistant Examiner* — Ryan Jager
(74) *Attorney, Agent, or Firm* — Lawrence J. Merkel; Meyertons, Hood, Kivlin, Kowert & Goetzel, P.C.; Erik A. Heter

(57) ABSTRACT

A flop circuit comprises a precharge circuit for precharging a first node in response to an occurrence of a first phase of a timing signal, and a discharge circuit for conditionally discharging the first node in response to an occurrence of a second phase of the timing signal depending upon a data input signal. The flop circuit further comprises a voltage retention circuit, such as a latch, configured to store a retained logic value that depends upon a logic value present at the first node during at least a portion of the second phase of the timing signal, and an output circuit configured to generate an output signal that depends upon the data input signal. The output circuit may be configured to drive the output signal in a first logic state when the first node is discharged regardless of the retained logic value, and may be configured to drive the output signal in a logic state that depends upon the retained logic value when the first node is charged. In one particular embodiment, the output circuit is implemented using a NAND gate.

17 Claims, 4 Drawing Sheets

US 8,026,754 B2

LOW LATENCY FLOP CIRCUIT

BACKGROUND OF THE INVENTION

1. Field of the Invention

This invention relates to electronic circuits, and more particularly, to flop circuits for providing temporary storage.

2. Description of the Related Art

Flip-flops and other types of flop circuits are well known in the art of digital circuits. Flop circuits are designed to provide temporary storage of logic values and to propagate these values synchronously with a clock signal. Common types of flop circuits include D-type flip-flops, J-K flip-flops, S-R flip-flops, and so forth. Pulse flops are another form of flop circuit that propagates logic values synchronously with a pulse. Each of these flop circuits is configured to provide at least one output signal based on the input signal(s).

Many types of flop circuits include a master stage and a slave stage. One or more data input signals and a clock signal (or pulse) may be input into the master stage. The master stage may produce one or more additional signals in response to the data input signals. These additional signals may then be conveyed to the slave stage responsive to the master stage receiving an edge of the clock signal or a pulse. The slave stage may then perform additional logic functions on the signals received from the master stage and provide one or more output signals (e.g., an output data signal and a complement of the output data signal).

In choosing a flop circuit for a particular application, a number of different factors may be considered. These factors may include consideration of the input and output signals required for the particular application, switching speed, power consumption, area consumption, and so forth. In some cases, trade-offs between these factors may need to be considered in order to choose the most appropriate design.

SUMMARY OF THE INVENTION

Various embodiments of a flop circuit are disclosed. In one embodiment, a flop circuit comprises a precharge circuit configured to precharge a first node in response to an occurrence of a first phase of a timing signal (e.g., a clock signal), and a discharge circuit configured to conditionally discharge the first node in response to an occurrence of a second phase of the timing signal depending upon a data input signal. The flop circuit further comprises a voltage retention circuit, such as a latch, configured to store a retained logic value that depends upon a logic value present at the first node during at least a portion of the second phase of the timing signal, and an output circuit configured to generate an output signal that depends upon the data input signal. The output circuit may be configured to drive the output signal in a first logic state when the first node is discharged regardless of the retained logic value, and may be configured to drive the output signal in a logic state that depends upon the retained logic value when the first node is charged. In one particular embodiment, the output circuit may be implemented using a NAND gate.

BRIEF DESCRIPTION OF THE DRAWINGS

Other aspects of the invention will become apparent upon reading the following detailed description and upon reference to the accompanying drawings in which.

Figure 1:
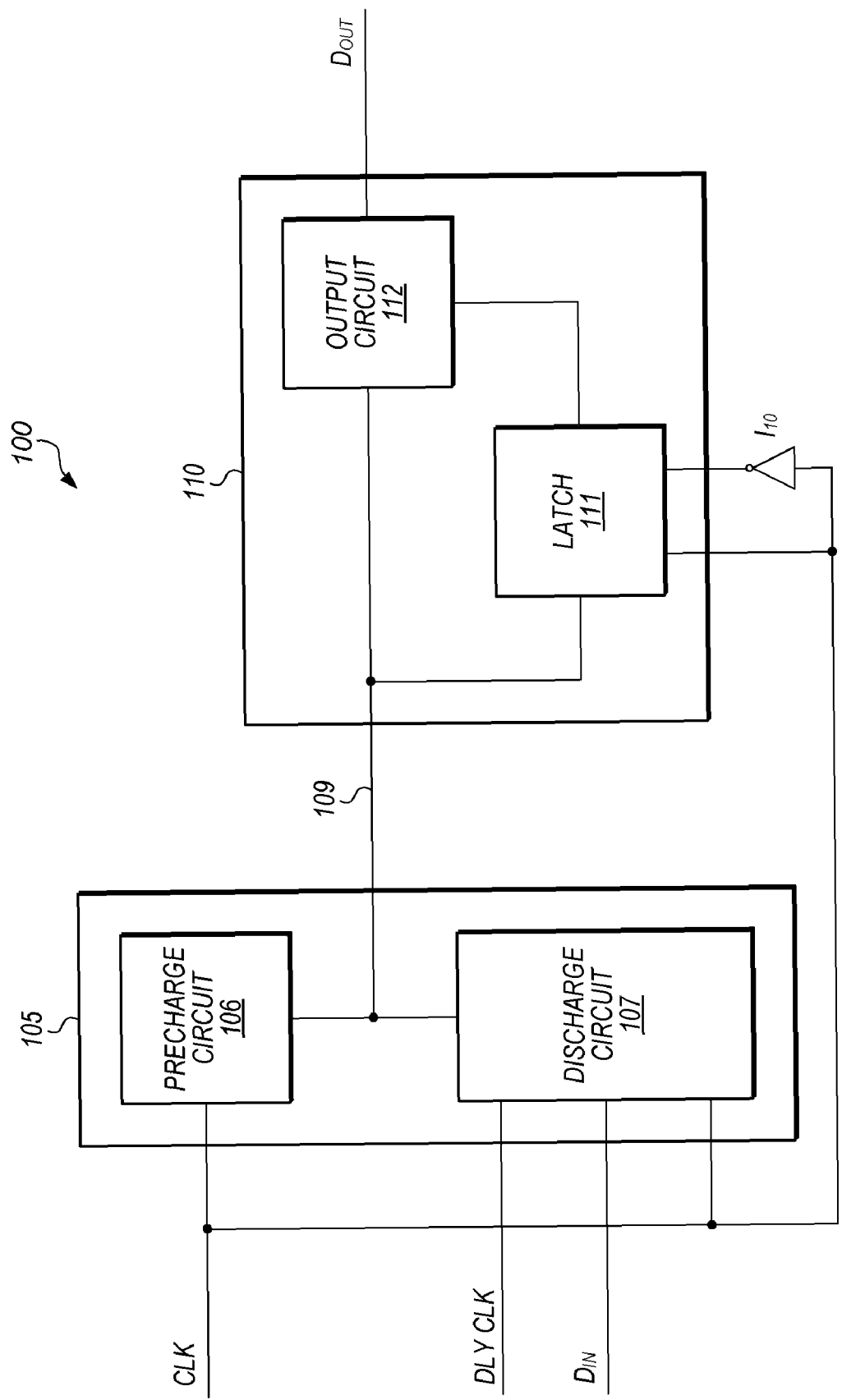
FIG. 1 is a block diagram of one embodiment of a flop circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Turning now to FIG. 1, a block diagram of one embodiment of a flop circuit is shown. In the illustrated embodiment, flop circuit 100 includes a first stage 105 and a second stage 110. First stage 105 is an input stage that includes a precharge circuit 106 and a discharge circuit 107. Precharge circuit 106 is coupled to receive a clock signal ('CLK'), and discharge circuit 107 is coupled to receive the clock signal, as well as a data input signal ('$D_{IN}$') and a delayed clock signal ('DLY CLK'). Both the clock signal and the delayed clock signal include respective first and second phases (e.g., clock low during first phase, clock high during second phase). In one particular embodiment, precharge circuit 106 is configured to unconditionally precharge node 109 during the first phase of the clock signal. On the other hand, discharge circuit 107 is configured to conditionally discharge node 109, depending on the state of the data signal, when both the clock signal and the delayed clock signal are concurrently in their respective second phases, as will be explained in further detail below.

In the embodiment shown, second stage 110 is an output stage and includes a latch 111 and an output circuit 112. Latch 111 is coupled to receive both the clock signal and an inverted clock signal (via inverter 110), and is further coupled to receive a signal from node 109. Output circuit 112 is also coupled to receive the signal from node 109, and is further coupled to receive an output signal of latch 111. Latch 111 is configured to, during the second phase of the clock signal, capture and store the logic value of the signal present on node 109 (or another signal indicative thereof). The logic value of the signal present on node 109 during the second phase of the clock cycle may be a complement of the data input signal ('$D_{IN}$'), although embodiments are possible and contemplated wherein the logic values of the data input signal and the signal present on node 109 are equivalent. Output circuit 112 is also configured to provide an output signal ('$D_{OUT}$') which may have the same logic value as the data input signal (although embodiments where $D_{IN}$ and $D_{OUT}$ are logical complements of each other are also possible and contemplated).

Figure 2:
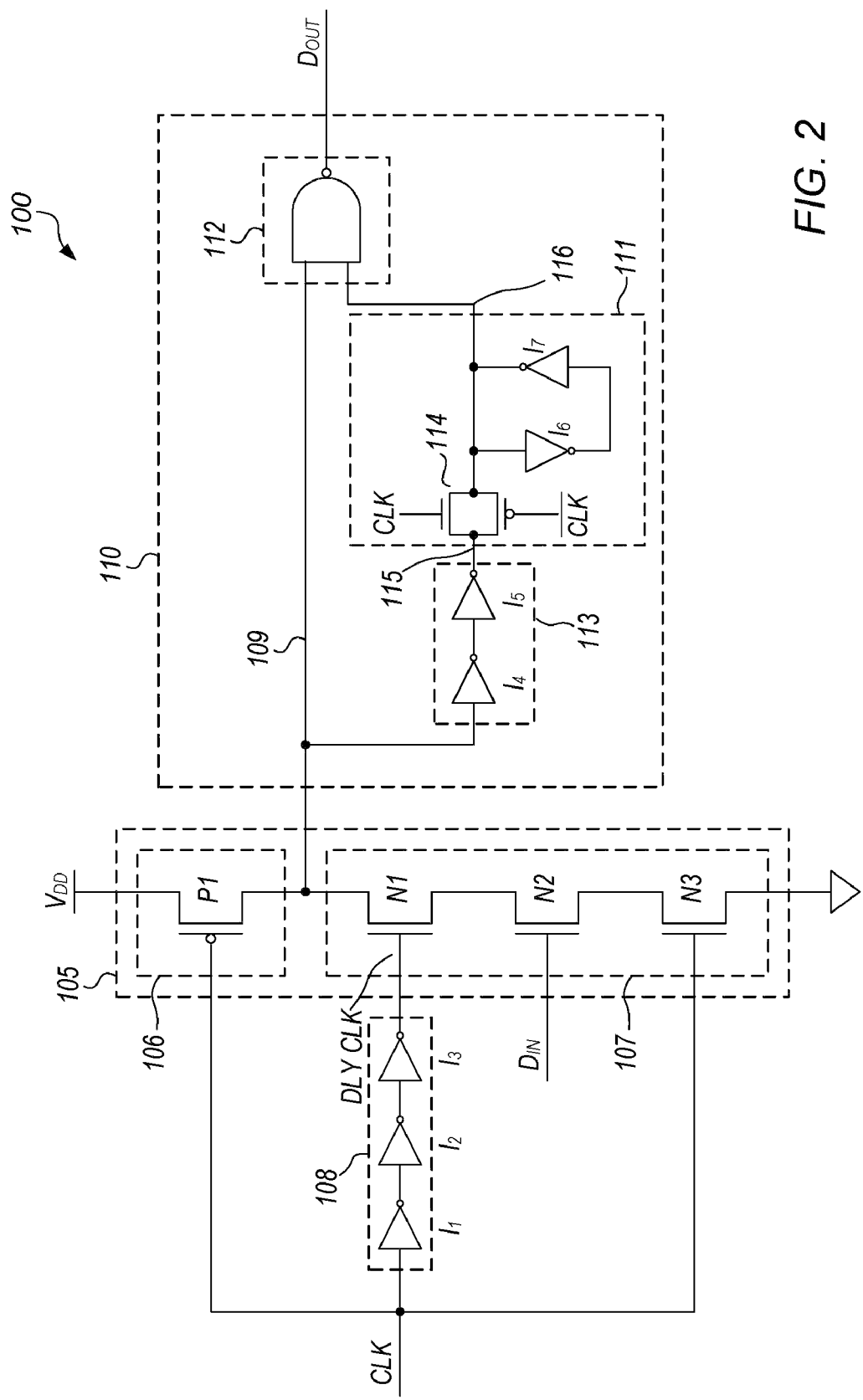
FIG. 2 is a schematic diagram of one embodiment of a flop circuit.

Turning now to FIG. 2, a schematic diagram of one embodiment of the flop circuit 100 of FIG. 1 is shown. As such, the flop circuit 100 of FIG. 2 includes both an input stage 105 (including a precharge circuit 106 and a discharge circuit 107) and an output stage 110 (including a latch 111 and an output circuit 112), as discussed above.

Precharge circuit 106 in this embodiment includes a PMOS transistor, P1, having source and drain terminals coupled between a voltage supply node $V_{DD}$ and node 109 (which may be referred to as a data node). The gate terminal of transistor P1 is coupled to receive the clock signal (CLK). The clock signal (CLK) has a repetitive cycle that includes a first phase (e.g., when the clock signal is low) and a second phase (e.g., when the clock signal is high). When the clock signal is low (e.g., first phase in this embodiment), transistor P1 becomes active, thereby providing a pull-up path between node 109 and $V_{DD}$. Thus, in this embodiment, precharge circuit 109 is configured to unconditionally precharge node 109 during the first phase of the clock cycle. In this embodiment, node 109 is considered to have a logic value of '1' when precharged. It is noted that when the clock signal is high, transistor P1 is turned off.

Discharge circuit 107 in the embodiment shown includes a stack of NMOS transistors, N1, N2, and N3, coupled in series between a second voltage supply node, such as a ground reference node. Transistors N1, N2 and N3 receive as input signals (on their respective gate terminals) a delay clock signal ('DLY CLK'), a data input signal ('$D_{IN}$') and the clock signal (CLK).

The embodiment of flop circuit 100 shown in FIG. 2 includes a delay circuit 108 configured to produce the delayed clock signal. Delay circuit 108 as shown includes inverters I1, I2, and I3 coupled together in series. Other embodiments of a delay circuit 108 are possible and contemplated, and may use any type of circuitry suitable for implementing a delay (e.g., buffers, long signal lines, a different number of inverters, etc.). In this embodiment, inverter I1 is coupled to receive the clock signal as an input signal, while inverter I3 is coupled to provide the delayed clock signal as an output signal. The inverters of delay circuit 108 collectively add delay such that the respective phases of the clock signal and the delayed clock signal are offset, with some overlap between the phases (i.e. a portion of the first phase of the clock signal overlaps with a portion of the first phase of the delayed clock signal). Furthermore, the delayed clock signal produced by delay circuit 108 is a logical inversion of the clock signal. Thus, when the clock signal transitions high, the delayed clock signal will transition low at a delay time later, in accordance with the delay added by delay circuit 108.

Transistor N1 of the discharge circuit 107 is coupled to receive the delayed clock signal from delay circuit 108, and is configured to be active (i.e. turned on) when the delayed clock signal is high. Likewise, transistor N3 is coupled to receive the clock signal, and is configured to be active when the clock signal is high. Transistor N2 is coupled to receive the data input signal, and is configured to be active when the data input signal is high. Thus, when the data input signal is high (thereby causing N2 to become active), while both the clock signal and the delayed clock signal are also high (e.g., both are concurrently in their respective second phases), a pull down path exists between node 109 and ground. Accordingly, node 109 is conditionally discharged, depending on the state of the data input signal when both transistors N1 and N3 are active. If the data input signal is high (e.g., a logic '1'), then node 109 is discharged to ground (e.g., to a logic '0'). Otherwise, if the data input signal is low, discharge circuit 107 does not discharge node 109. It should be noted that while this particular embodiment results in a logical inversion of the data signal relative to the resultant signal on node 109 (i.e. if $D_{IN}$=1, node 109=0 when CLK and DLY CLK both high), embodiments where no logical inversion takes place are also possible and contemplated.

As previously noted, output stage 110 includes a latch 111 and an output circuit 112. In this embodiment, output stage 110 also includes a second delay circuit, delay circuit 113. In this particular embodiment, delay circuit 113 is implemented using an inverter chain including inverters I4 and I5. A greater or lesser number of inverters may be used in other embodiments, as well as other types of suitable circuitry for implementing a delay of the clock signal. Delay circuit 113 is coupled to receive the signal present on node 109 and is configured to provide at node 115 an output signal having a logic value that is dependent on the signal at node 109.

Latch 111 in the embodiment shown includes a passgate 114 and a keeper circuit comprising cross-coupled inverters I6 and I7. Latch 111 is configured to capture the logic value of the signal present on node 115 during the second phase of the clock cycle. Passgate 114 includes an NMOS transistor coupled to receive the clock signal (CLK) and a PMOS transistor coupled to receive a logical complement of the clock signal ($\overline{CLK}$). The logical complement of the clock signal ($\overline{CLK}$) may be provided by an inverter such as I10 shown in FIG. 1, although no such inverter is shown here for the sake of simplicity. When the clock signal is high (and thus the complementary clock signal is low), the transistors of passgate 114 will become active and thus the signal present on node 115 will be transparent to node 116. The logic value of the signal present on node 115 may thus be captured and stored by the keeper circuit comprising cross-coupled inverters I6 and I7. It should be noted that embodiments utilizing different types of circuitry to implement latch 111 (e.g., such as cross-coupled NAND gates for the keeper and a domino switching circuit in place of the passgate) are also possible, and that other voltage retention (or capture) circuits that function to selectively store a logic value that depends on the signal at node 109 are possible.

Output circuit 112 in the embodiment shown is a 2-input NAND gate. The first of these inputs is coupled to node 109, while the second of these inputs is coupled to node 116 (of latch 111). Accordingly, the output signal in this embodiment is generated by performing a NAND function of the logic values of the signals present on nodes 109 and 116. Furthermore, since the logic value of the signal present on node 109 when the clock is high propagates to latch 111 (and thus to node 116), the logic values of both inputs of the output circuit 112 will eventually be the same logical value (accounting for the propagation delay between nodes 109 and 116). Since output circuit 112 is a NAND gate, if both inputs are logic 1's, the output will be a logic 0, and vice versa. However, since the logic value of the signal on node 109 in this embodiment will be the complement of that of the data input signal, the data output signal $D_{OUT}$ will be logically equivalent to the data input signal. It is noted that other embodiments are possible and contemplated wherein the data output signal will be the logical complement of the data input signal. For example, if output circuit 112 was implemented using an AND gate instead of a NAND gate, a data input signal having a logic 1 value would result in a data output signal having a logic 0 value, and vice versa.

The arrangement of output stage 110 in the embodiment shown may affect the speed at which the output signal transitions from one logic value to the other. For example, if node 109 is discharged responsive to the clock signal transitioning high (when the data input signal $D_{IN}$ is logically high), the resulting logic 0 on node 109 will cause $D_{OUT}$ to transition high (if previously low) even if the logic 0 has not completed propagation from node 109 to node 116. It is noted, on the other hand, that if node 109 is not discharged responsive to the clock signal transitioning high (i.e. $D_{IN}$ is logically low), $D_{OUT}$ will not transition low (if previously high) until the logic 1 from node 109 has propagated to node 116.

It is noted that other circuitry for implementing output circuit 112 are possible in other embodiments. For example, as mentioned above, in one alternative embodiment, an AND gate may be provided in the place of the illustrated NAND gate. In still other embodiments, output circuit 112 may be implemented using any other form of logic circuitry that drives the output signal $D_{OUT}$ in a first logic state when node 109 is discharged regardless of the retained logic value at node 116, and that drives the output signal in a logic state that depends upon the retained logic value at node 116 when node 109 is charged.

Figure 3:
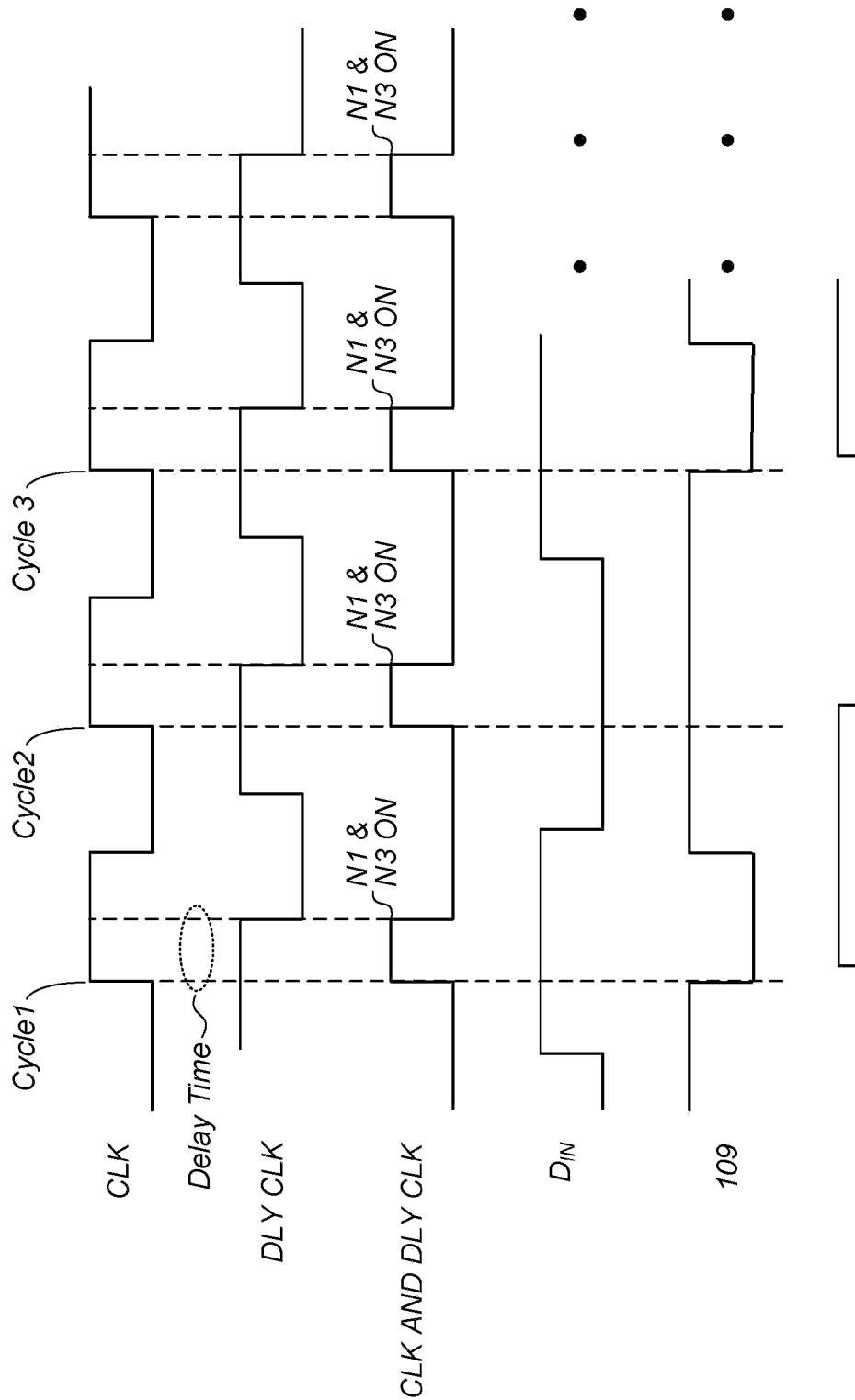
FIG. 3 is a timing diagram illustrating operation of one embodiment of a flop circuit.

FIG. 3 is a timing diagram illustrating operation of the embodiment of flop circuit 100 discussed above with reference to FIG. 2. As noted above, the delayed clock signal produced by delay circuit 108 is a delayed and inverted version of the clock signal. Thus, when the clock signal transitions high, the delayed clock signal will transition low after a delay time has elapsed. Similarly, when the clock signal transitions low, the delayed clock signal will transition high after a delay time has elapsed. When the clock signal initially transitions high, a condition is produced where both the clock signal and the delayed clock signal are high. This condition is indicated in the drawing by the timing signal that is accompanied with the nomenclature 'CLK AND DLY CLK'. The pulse shown in the drawing is not an actual pulse, but is indicative of the condition described herein. However, embodiments are possible and contemplated wherein an actual pulse indicative of this condition is produced (e.g., by actually ANDing the clock pulse and the delayed clock pulse). In either case, the width of the pulse shown in the timing diagram may be determined by the amount of delay provided by delay circuit 108, or more generally, by the amount of phase offset between the clock signal and the delayed clock signal, and this pulse may fall low when the delayed clock signal falls low. It is noted that in various embodiments wherein an actual pulse is generated, transistors N1 and N3 of discharge circuit 107 may be replaced by a single transistor having a gate that receives the pulse signal.

In the timing diagram, three cycles are illustrated, each beginning on the rising edge of the clock signal. When both the clock signal and the delayed clock signal are high, both transistors N1 and N3 of flop circuit 100 are controlled to be in their active states. Thus, upon a low-to-high transition of the clock signal, the state of the data input signal, $D_{IN}$ determines the state of the signal at node 109. In cycle 1, $D_{IN}$ is high (e.g., logic 1) when the clock signal transitions high. Thus, transistors N1, N2, and N3 will all be concurrently active, and node 109 will be discharged to a low voltage (e.g., logic 0) as shown in the timing diagram. Node 109 will remain at the logic 0 value even after the delayed clock signal falls low (which results in the deactivation of transistor N1). The logic 0 on node 109 will propagate to one of the inputs of output circuit 112, and will also propagate to node 115. During the time that the clock signal is high, passgate 114 is active, and thus provides a path for signal propagation from node 115 to node 116. Accordingly, the logic 0 that originated on node 109 due to the discharge operation will propagate into latch 111, where it may override a logic value previously stored by the keeper circuit of inverters I6 and I7. Since the embodiment of flop circuit 100 as illustrated is such that the data output signal, $D_{OUT}$, will logically follow the input signal ($D_{IN}$), the data output signal transitions high (assuming it was previously low, as shown) as a result of the operation described in cycle 1.

When the clock signal subsequently falls low, node 109 will again transition high, due to the precharge operation caused by the activation of transistor P1. However, the precharge operation will not affect the state of $D_{OUT}$, since passgate 114 will become inactive responsive to the clock signal falling low, thereby isolating node 116 from node 115. Since the previous logic value of the signal on node 109 is captured and stored by the keeper circuit of latch 111, the state of $D_{OUT}$ is maintained accordingly.

In the particular example illustrated by the timing diagram, when the clock signal again transitions high to begin cycle 2, the data input signal $D_{IN}$ is low. Thus, even though transistors N1 and N3 are controlled to be in their active states responsive to the low-to-high transition of the clock cycle, transistor N2 will remain inactive. As a result, node 109 is not discharged and instead maintains a logic high voltage condition (e.g. a logic 1). This results in a logic high value to be captured and stored by latch 111, and further results in $D_{OUT}$ falling low to a logic 0. At the beginning of cycle 3, $D_{IN}$ is high (logic 1) again, and thus node 109 is discharged and the operation described for cycle 1 is repeated.

Various embodiments of the flop circuits as described herein may achieve relatively fast operation in comparison to conventional flop circuits. For example, as explained previously with regard to the embodiment of FIG. 2, due to the configuration of output stage 210, in instances when node 109 is discharged responsive to the data input signal being high (and the clock signal transitioning high), the data output signal $D_{OUT}$ transitions high (if previously low) even if the logic 0 value has not completed propagation from node 109 to node 116, thus resulting in a particularly low latency. Furthermore, various embodiments of this circuit may also perform well in low voltage environments.

Figure 4:
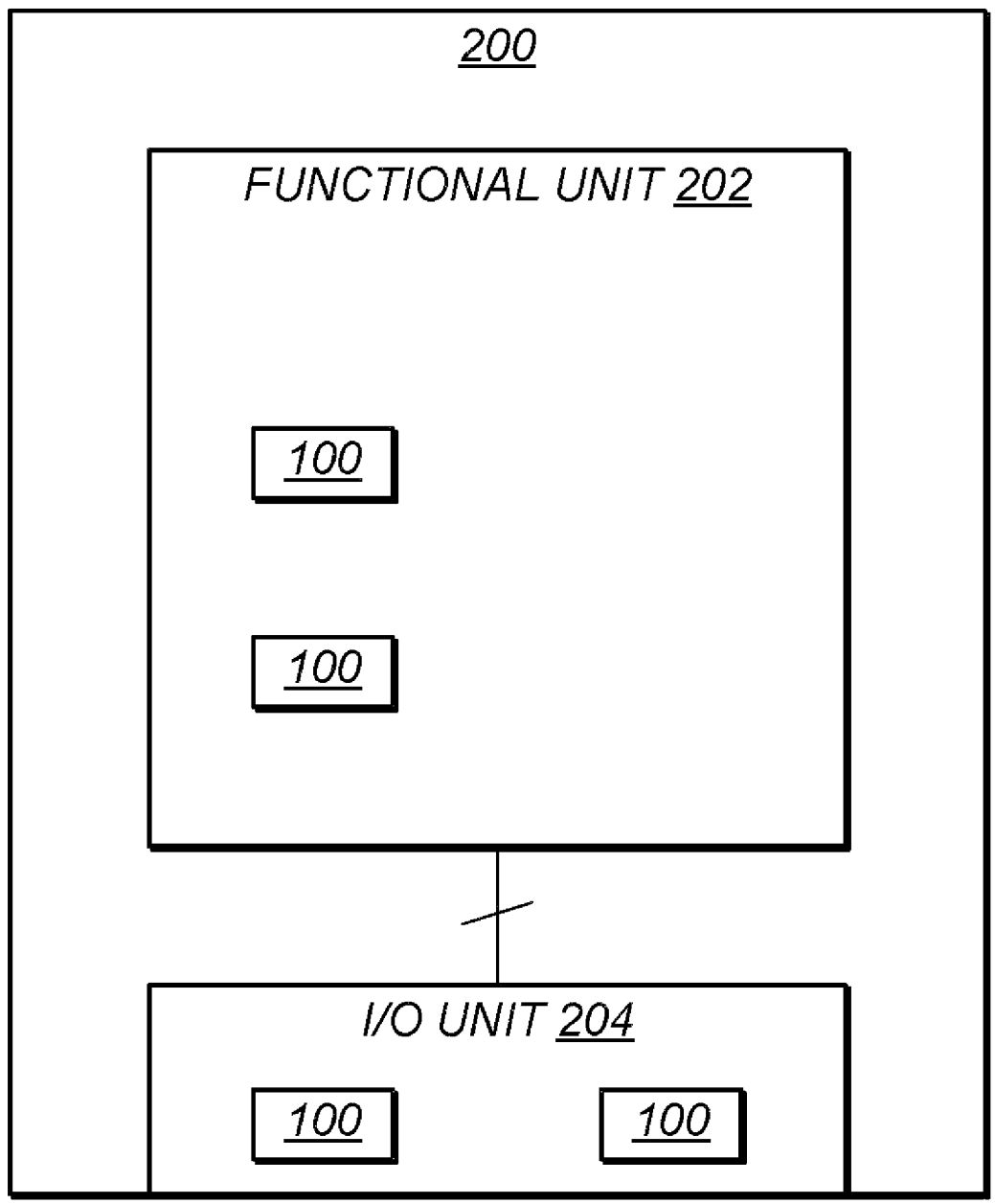
FIG. 4 is a block diagram of one embodiment of an integrated circuit.

The flop circuit as described herein may be used for a variety of applications. In various embodiments, an integrated circuit may be fabricated that employs numerous instances of the flop circuit as described above for providing temporary storage of data (including, e.g., instruction code). Such an integrated circuit may be configured to perform any of variety of specific functions, as desired. For example, the integrated circuit may embody a general purpose processor or a specialized processor, such as an audio, video, or graphics processing circuit. The integrated circuit may instead embody an application specific IC (ASIC). FIG. 4 illustrates an exemplary integrated circuit (IC) 200 including a functional unit 202 for performing internal functions of the integrated circuit, and an input/output (I/O) unit 204 for accommodating external communications or transfers of data. Functional unit 202 and I/O unit 204 in the embodiment shown each include a plurality of flop circuits 100 that provide temporary storage of data within the integrated circuit.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic circuit comprising:
a precharge circuit configured to precharge a first node in response to an occurrence of a first phase of a timing signal;
a discharge circuit configured to conditionally discharge the first node in response to an occurrence of a second phase of the timing signal depending upon a data input signal;
a voltage retention circuit configured to store a retained logic value that depends upon a logic value present at the first node during at least a portion of the second phase of the timing signal, wherein the voltage retention circuit includes a latch circuit and a delay circuit coupled between the first node and an input of the latch circuit; and an output circuit configured to generate an output signal that depends upon the data input signal, wherein the output circuit is configured to drive the output signal in a first logic state when the first node is discharged regardless of the retained logic value, and wherein the output circuit is configured to drive the output signal in a logic state that depends upon the retained logic value when the first node is charged; wherein the output circuit includes a NAND gate having a first input coupled to the first node and a second input coupled to receive the retained logic value from the voltage retention circuit.

2. The electronic circuit as recited in claim 1, wherein the timing signal is a clock signal.

3. The electronic circuit as recited in claim 1, wherein the precharge circuit comprises a PMOS transistor coupled between a voltage supply node and the first node and having a gate coupled to receive the timing signal.

4. The electronic circuit as recited in claim 1, wherein the discharge circuit includes a plurality of transistors coupled in series between the first node and a first voltage supply node, wherein a gate of a first transistor of the plurality of transistors is coupled to receive the data input signal.

5. The electronic circuit as recited in claim 4, wherein a gate of a second transistor of the plurality of transistors is coupled to receive the timing signal, and wherein a gate of a third transistor of the plurality of transistors is coupled to receive a delayed version of the timing signal.

6. The electronic circuit as recited in claim 5, wherein the precharge circuit includes a fourth transistor coupled between the first node and a second voltage supply node, wherein a gate of the fourth transistor is coupled to receive the timing signal.

7. A flop circuit comprising:
a first stage including:
a precharge circuit configured to precharge a first node to a first logic level during a first phase of a clock signal;
a discharge circuit configured to, when both the clock signal and a delayed clock signal are in respective second phases, discharge the first node to a second logic level if the data input signal is at the first logic level; and
a second stage including a capture circuit and an output circuit, wherein the output circuit includes a first terminal coupled receive a first signal from the first node, wherein the capture circuit is configured to capture and store a logic value indicative of the first signal, and wherein the output circuit is configured to provide an output signal depending on the captured logic value, wherein the capture circuit is coupled to receive the first signal through a passgate and is configured to capture the logic value indicative of the first signal during the second phase of the clock signal, and wherein the output circuit includes a NAND gate having a first input coupled to the first node and a second input coupled to receive the logic value indicative of the first signal from the capture circuit.

8. The electronic circuit as recited in claim 7, wherein the capture circuit includes a keeper circuit configured to store the logic value indicative of the first signal.

9. The electronic circuit as recited in claim 7, wherein the capture circuit is a latch circuit.

10. The electronic circuit as recited in claim 7, further comprising a delay circuit coupled to receive the clock signal and configured to provide delay to the clock signal in order to produce the delayed clock signal.

11. An integrated circuit comprising:
a functional unit configured to perform one or more logical functions of the integrated circuit, wherein the functional unit includes a plurality of flop circuits configured to store data associated with the logical functions, wherein each of the flop circuits includes:
a precharge circuit configured to precharge a first node in response to an occurrence of a first phase of a timing signal;
a discharge circuit configured to conditionally discharge the first node in response to an occurrence of a second phase of the timing signal depending upon a data input signal;
a voltage retention circuit configured to store a retained logic value that depends upon a logic value present at the first node during at least a portion of the second phase of the timing signal, wherein the voltage retention circuit includes a latch circuit and a delay circuit coupled between the first node and an input of the latch circuit; and
an output circuit configured to generate an output signal that depends upon the data input signal, wherein the output circuit is configured to drive the output signal in a first logic state when the first node is discharged regardless of the retained logic value, and wherein the output circuit is configured to drive the output signal in a logic state that depends upon the retained logic value when the first node is charged, wherein the output circuit includes a NAND gate having a first input coupled to the first node and a second input coupled to receive the retained logic value from the voltage retention circuit.

12. The integrated circuit as recited in claim 11, wherein the precharge circuit comprises a PMOS transistor coupled between a voltage supply node and the first node and having a gate coupled to receive the timing signal.

13. The integrated circuit as recited in claim 12, wherein the discharge circuit includes a plurality of additional transistors coupled in series between the first node and a ground reference node, wherein a gate of a first transistor of the plurality of additional transistors is coupled to receive the data input signal.

14. A data storage circuit comprising:
a precharge transistor coupled between a first voltage supply node and a first node, wherein the precharge transistor is configured to precharge the first node during a first phase of a clock signal;
a discharge circuit coupled between the first node and a second voltage supply node, wherein the discharge circuit includes a first NMOS transistor having a gate coupled to receive a clock signal, a second NMOS transistor having a gate coupled to receive a data input signal, and a third NMOS transistor having a gate coupled to receive a delayed clock signal;
a latch circuit coupled to receive and store a logic value that is dependent on a voltage at the first node during a second phase of the clock signal; and
a NAND gate having a first input coupled to the first node and a second input coupled to receive the stored logic value of the latch circuit.

15. The data storage circuit as recited in claim 14 further comprising a plurality of inverters coupled to receive the clock signal and further coupled in series to provide the delayed clock signal to the third NMOS transistor, wherein the plurality of inverters consists of an odd number of inverters.

16. The data storage circuit as recited in claim 14, wherein the second voltage supply node is a ground node.

17. The data storage circuit as recited in claim 14, wherein the discharge circuit is configured to discharge the first node only when the second NMOS transistor is active.

* * * * *